(12) United States Patent
Chan et al.

(10) Patent No.: US 8,361,827 B2
(45) Date of Patent: Jan. 29, 2013

(54) ASSEMBLY TECHNIQUES FOR SOLAR CELL ARRAYS AND SOLAR CELLS FORMED THEREFROM

(75) Inventors: Raymond Chan, Hoffman Estates, IL (US); Christopher Youtsey, Libertyville, IL (US)

(73) Assignee: MicroLink Devices, Inc., Niles, IL (US)

( * ) Notice: Subject to any disclaimer, the term of this patent is extended or adjusted under 35 U.S.C. 154(b) by 371 days.

(21) Appl. No.: 12/773,582

(22) Filed: May 4, 2010

(65) Prior Publication Data

US 2010/0275969 A1    Nov. 4, 2010

Related U.S. Application Data

(60) Provisional application No. 61/175,259, filed on May 4, 2009.

(51) Int. Cl.
*H01L 21/00* (2006.01)
(52) U.S. Cl. ............ 438/57; 257/E27.124; 257/E27.125
(58) Field of Classification Search .................... 438/57, 438/67; 257/E27.124, E27.125, E27.126; 136/244, 251, 255, 256, 259
See application file for complete search history.

(56) References Cited

U.S. PATENT DOCUMENTS

| | | | |
|---|---|---|---|
| 5,616,185 | A | 4/1997 | Kukulka |
| 5,660,646 | A | 8/1997 | Kataoka et al. |
| 6,239,354 | B1 | 5/2001 | Wanlass |
| 7,115,811 | B2 | 10/2006 | Ho et al. |
| 7,480,990 | B2 | 1/2009 | Fitzsimmons et al. |
| 2007/0079866 | A1 | 4/2007 | Borden et al. |
| 2007/0238285 | A1 | 10/2007 | Borden |
| 2008/0108171 | A1 | 5/2008 | Rogers et al. |
| 2008/0157361 | A1 | 7/2008 | Wood et al. |

FOREIGN PATENT DOCUMENTS

JP       61202476 A  *  9/1986
WO   WO 2008054145 A1 *  5/2008

OTHER PUBLICATIONS

International Search Report for Application No. PCT/US2010/033570, dated Jul. 7, 2010.

* cited by examiner

*Primary Examiner* — Brook Kebede
(74) *Attorney, Agent, or Firm* — Nelson Mullins Riley & Scarborough LLP; Anthony A. Laurentano; Neslihan I. Doran

(57) ABSTRACT

An assembly technique for assembling solar cell arrays is provided. During the fabrication of a solar cell, openings through the semiconductor layer are etched through to a top surface of the backmetal layer. The solar cells include an exposed top surface of the backmetal layer. A plurality of solar cells are assembled into a solar cell array where adjacent cells are interconnected in an electrically serial or parallel fashion solely from the top surface of the solar cells.

13 Claims, 12 Drawing Sheets

ASSEMBLY TECHNIQUES FOR SOLAR CELL ARRAYS AND SOLAR CELLS FORMED THEREFROM

RELATED APPLICATION

This application claims priority to Provisional Application No. 61/175,259 filed on May 4, 2009, which is herein incorporated by reference in its entirety.

This invention was made with Government support under FA9453-09-C-0365 awarded by Air Force Research Laboratory. The Government has certain rights in the invention.

TECHNICAL FIELD

The present application concerns photovoltaic devices, such as solar cell devices. More specifically, the present application concerns an assembly technique for forming solar cell arrays by interconnecting adjacent solar cells solely from one surface thereof.

BACKGROUND

A photovoltaic device converts light energy into electricity. Although the term "solar cell device" may sometimes be used to refer to a device that captures energy from sunlight, the terms "solar cell device" and "photovoltaic device" are interchangeably used in the present application regardless of the light source.

A conventional semiconductor solar cell 100 illustrated in FIG. 1 includes three layers. The first layer 104 is formed by a metal grid on the second layer. The second layer 106 is formed by a semiconductor material on the third layer. The third layer 108, i.e. the bottom or back layer, is a metal blanket layer.

Conventionally, adjacent solar cells are assembled into a solar cell array using interconnect tabs connected to the front and back surfaces of the solar cells. FIGS. 2A-2D depict an exemplary solar cell array 200 where interconnect tabs 206 are used to connect adjacent cells 100 in a serial fashion. The conventional method for assembling solar cells into a solar cell array does not facilitate high-volume assembly of solar cell arrays because connections need to be made to both the back and front surfaces of the solar cells as shown in FIGS. 2A-2D.

FIG. 2A illustrates a cross-sectional view of a conventional solar cell array 200 assembled according to conventional methods. In particular, FIG. 2A illustrates the interconnect tabs 206 contacting the top and bottom surface of adjacent solar cells 100. As shown in FIG. 2A, the interconnect tab 206 is connected to a bottom surface of the back layer 108 of the first conventional solar cell 100 to form a bottom connection 204. The interconnect tab 206 is also connected to a top surface of the semiconductor layer 106 of an adjacent second solar cell 101 to form a top or front connection 202.

A bonding tool performs at least two sweeps across the solar cell array to perform the conventional front connection 202 and the back connection 204 of the solar cells. The first sweep may be across the top or front surface of the semiconductor layer 106 of the solar cell array 200 for forming the front connections 202 illustrated in FIGS. 2A-2D. The second sweep may be across the back or bottom surface of the back metal layer 108 of the solar cell array 200 for forming the back connections 204 illustrated in FIGS. 2A-2D.

FIG. 2B is a top view of the conventional solar cell array illustrated in FIG. 2A. As illustrated in FIG. 2B, the top surface of the first solar cell 100 is connected to the bottom surface of the adjacent second solar cell 101 via the interconnect tab 206. A portion of the interconnect tab 206 is attached to the top surface of the first solar cell 100 to form the top or front connection 202. Another portion of the interconnect tab 206 is attached to the bottom surface of the second adjacent solar cell 101 to form the bottom connection 204.

FIG. 2C is a bottom view of the conventional solar cell array illustrated in FIG. 2A. As illustrated in FIG. 2B, in the conventional method, a tab 208 for a bypass diode connection is provided on the top surface of the semiconductor layer 106 of the conventional solar cell 100. As illustrated in FIG. 2C, one surface of the bypass diode 209 is connected to the back surface of the back metal layer 108 of the conventional same solar cell 100 while the opposite surface of the bypass diode 209 is connected to the aforementioned tab 208.

FIG. 2D is a side view close-up of an exemplary conventional interconnect tab 206 and the bypass diode tab 208 used in connection with the conventional solar cell array illustrated in FIGS. 2A-2C. As illustrated in FIG. 2D, the bypass diode tab 208 effectively wraps around the edge of the solar cell 100 to contact the bypass diode 209 to the top surface and effectively bypasses the solar cell when required.

Accordingly, a new method for assembling adjacent solar cells into a solar cell array is needed that facilitates high-volume assembly of solar cell arrays.

SUMMARY

Various embodiments of the present invention provide an assembly technique for assembling a plurality of solar cells into one or more solar cell arrays. During the fabrication of a solar cell, openings through the semiconductor layer are etched through to expose a top surface of the backmetal layer. During the assembly process, which follows the fabrication process, adjacent cells in a solar cell array are interconnected in an electrically serial or parallel fashion solely from one surface, e.g. the top surface, of the solar cells. The assembly method of the present invention and the solar cell structures formed using the assembly method enable manufacturing high-volume, automated assembly of solar cell array sheets.

In accordance with various embodiments of the present invention, a method for interconnecting a first solar cell adjacent to a second solar cell in an array of solar cells is provided. The method includes providing a first solar cell adjacent to a second solar cell. At least the first solar cell includes a semiconductor layer formed on top of a backmetal layer. The method also includes etching a portion of the semiconductor layer of the first solar cell to expose a portion of a top surface of the backmetal layer of the first solar cell. The method further includes interconnecting the first solar cell and the second solar cell by coupling the exposed top surface of the backmetal layer of the first solar cell to a top surface of the second solar cell using an interconnect tab.

According to an embodiment of the present invention, a solar cell array comprises a first solar cell and a second solar cell provided adjacent to the first solar cell. The first solar cell is formed of a semiconductor layer provided on top of a backmetal layer. A portion of the semiconductor layer of the first solar cell is etched to expose a portion of a top surface of the backmetal layer of the first solar cell. The first solar cell and the second solar cell are interconnected using an interconnect tab by coupling the etched portion of the top surface of the backmetal layer of the first solar cell to a top surface of the second solar cell.

According to another embodiment of the present invention, a method for forming an array of solar cells includes providing a plurality of solar cells. A solar cell includes a semiconductor layer formed on top of a backmetal layer leaving a portion of a top surface of the backmetal layer exposed. The method also includes applying an adhesive to a film layer and placing the plurality of solar cells onto the film layer. The plurality of solar cells are interconnected using one or more interconnect tabs by coupling the exposed top surface of the backmetal layer of a first solar cell to a top surface of an adjacent second solar cell. An adhesive is applied on the plurality of interconnected solar cells. The method further includes laminating a top film to the plurality of interconnected solar cells to form an array of solar cells.

BRIEF DESCRIPTION OF THE FIGURES

These and other characteristics of the present application will be more fully understood by reference to the following detailed description in conjunction with the attached drawings, in which.

DESCRIPTION

The present inventors have realized that for high-volume assembly of solar cell arrays, where the total annual production may exceed 100,000 square meters per year, it is advantageous to perform all the interconnect tabbing and bypass diode connections solely from a single side of a solar cell array, i.e. either from the front or back surface of the solar cell array. Examples of high volume assembly of solar cell arrays include, but are not limited to, applications such as unmanned aerial vehicles, satellites, solar blankets, and solar power generation. During a high volume assembly of solar cell arrays, a plurality of solar cells may be picked and placed with precision onto a film layer using an automated tool having optical alignment. Adjacent solar cells may be interconnected from the same surface, either the top surface of the bottom surface, of the solar cells. The film layer may be part of the final assembled solar cell array or, alternatively, the film layer may be a temporary carrier medium for assembly purposes. If the film layer is a temporary carrier medium for assembly purposed, the film layer may be removed after the solar cells are assembled into a solar cell array.

According to an exemplary embodiment of the present invention, a plurality of the solar cells may be laid out to form a solar cell array. Interconnections between adjacent solar cells and bypass diodes may be attached or connected to the plurality of solar cells only from one surface of the solar cell array, e.g. from the top side of the solar cell array. The foregoing manufacturing technique eliminates the need to access to the opposite surface, e.g. a back surface of the backmetal layer, of the solar cells. Once the interconnections and bypass diodes are placed and secured to the solar cells, a top sheet material may be laid across the solar cell assembly and secured in place.

As used herein, a top surface is the surface of the solar cell that faces, i.e. is directly exposed to, the light. As used herein, a bottom surface is the surface of the solar cell opposite to the top surface. The bottom surface faces away from the light.

Figure 1:
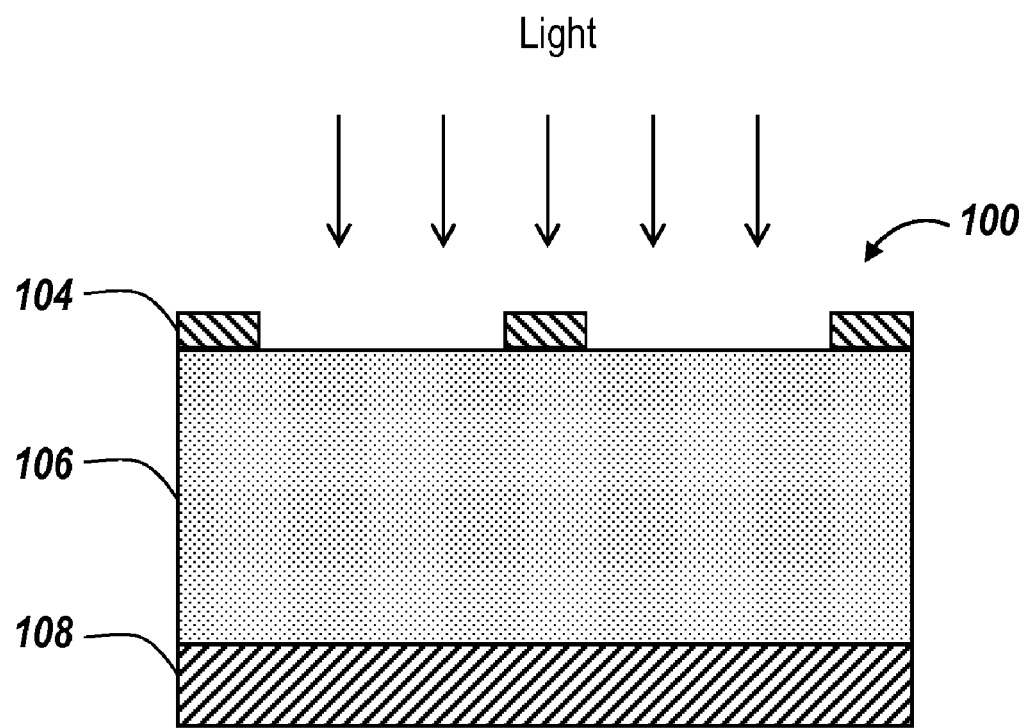
FIG. 1 is a cross-sectional view of a conventional solar cell.
Figure 2A:
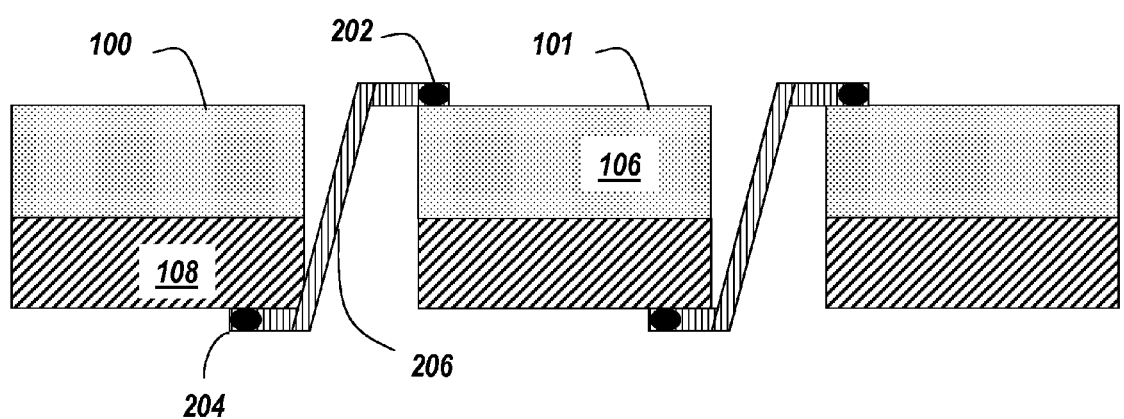
FIG. 2A is a cross-sectional view of a conventional solar cell array assembled according to conventional methods, and in particular illustrating the interconnect tabs contacting the top and bottom surface of adjacent solar cells.
Figure 2B:
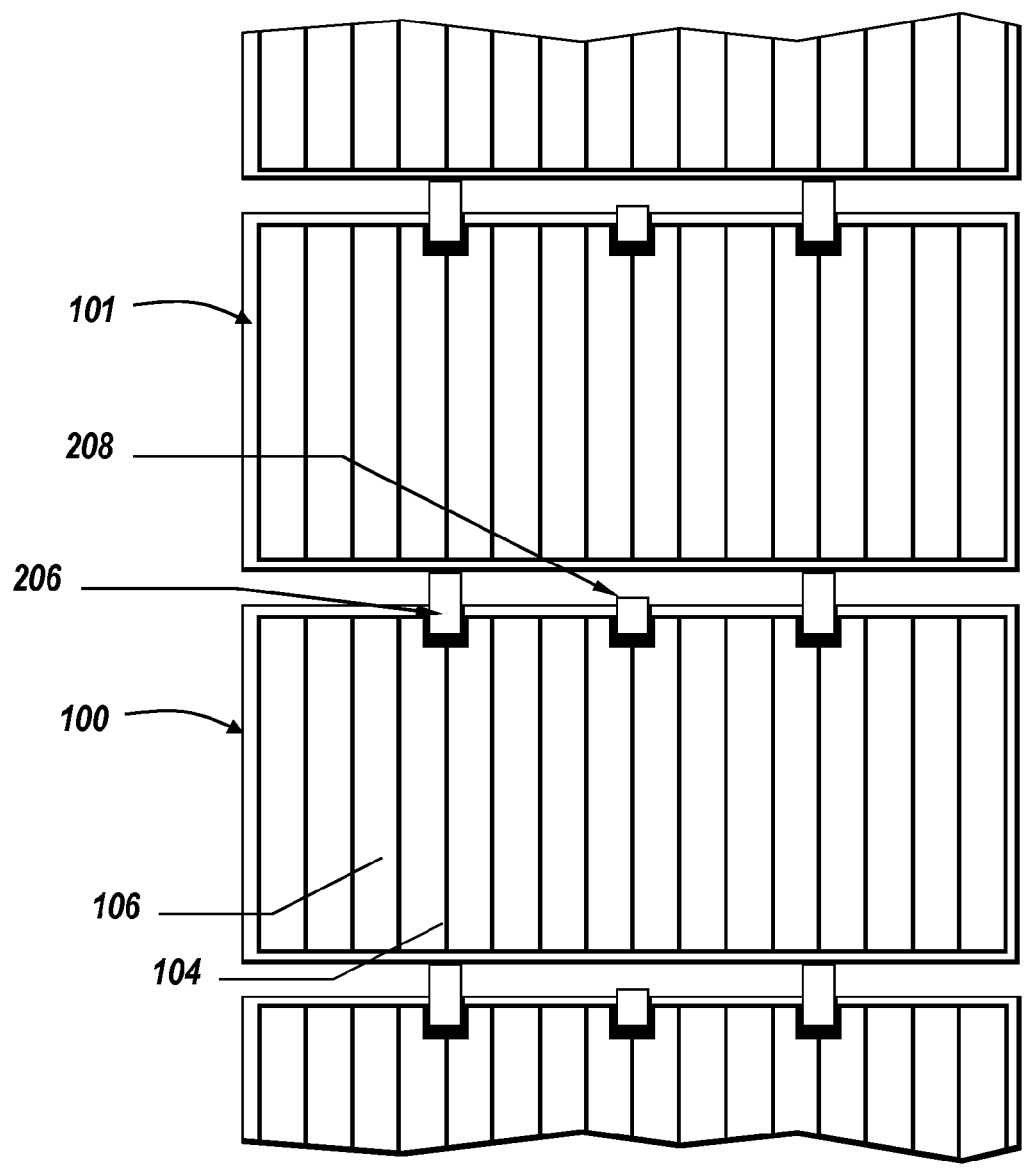
FIG. 2B is a top view of the conventional solar cell array illustrated in FIG. 2A.
Figure 2C:
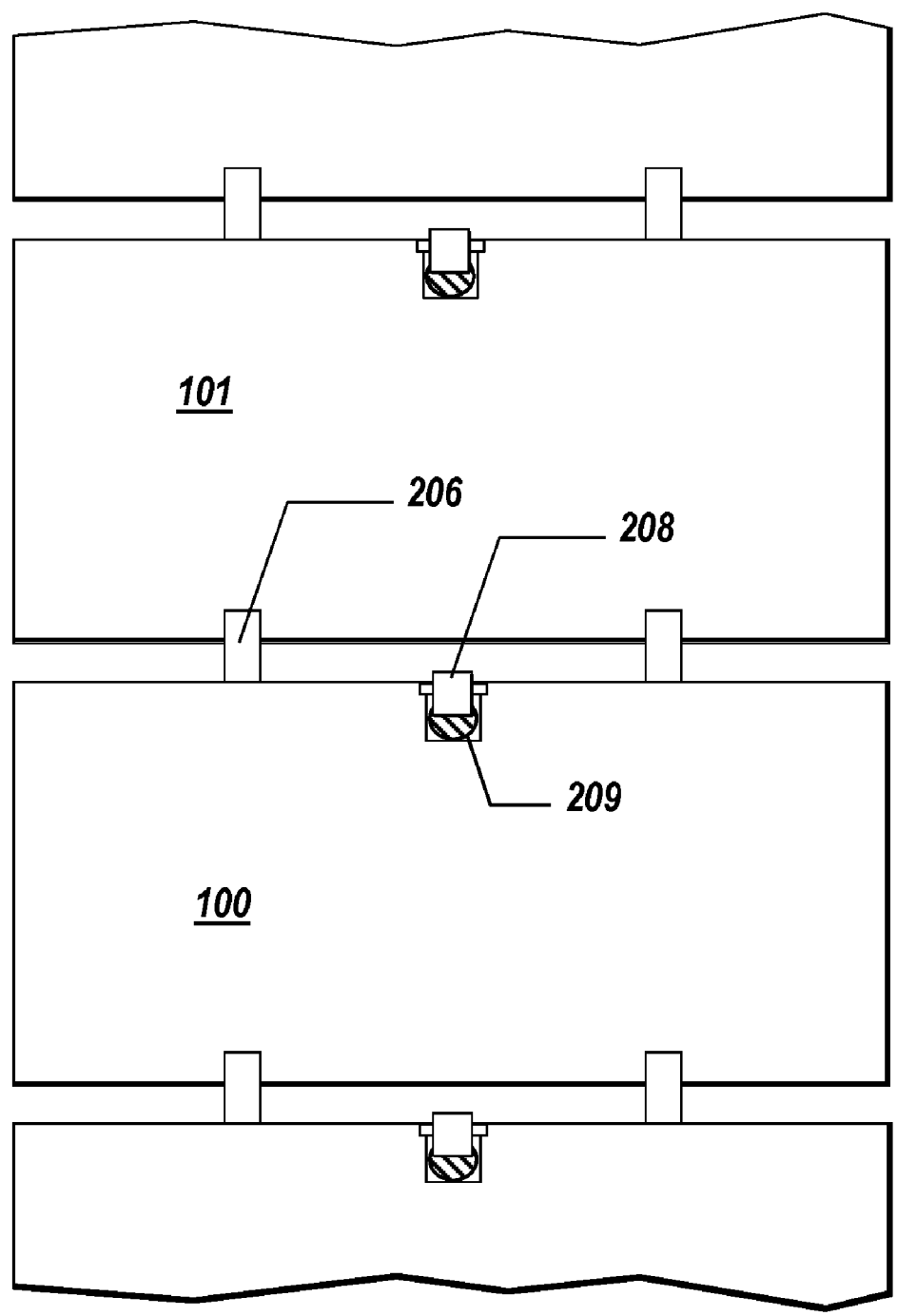
FIG. 2C is a bottom view of the conventional solar cell array illustrated in FIG. 2A.
Figure 2D:
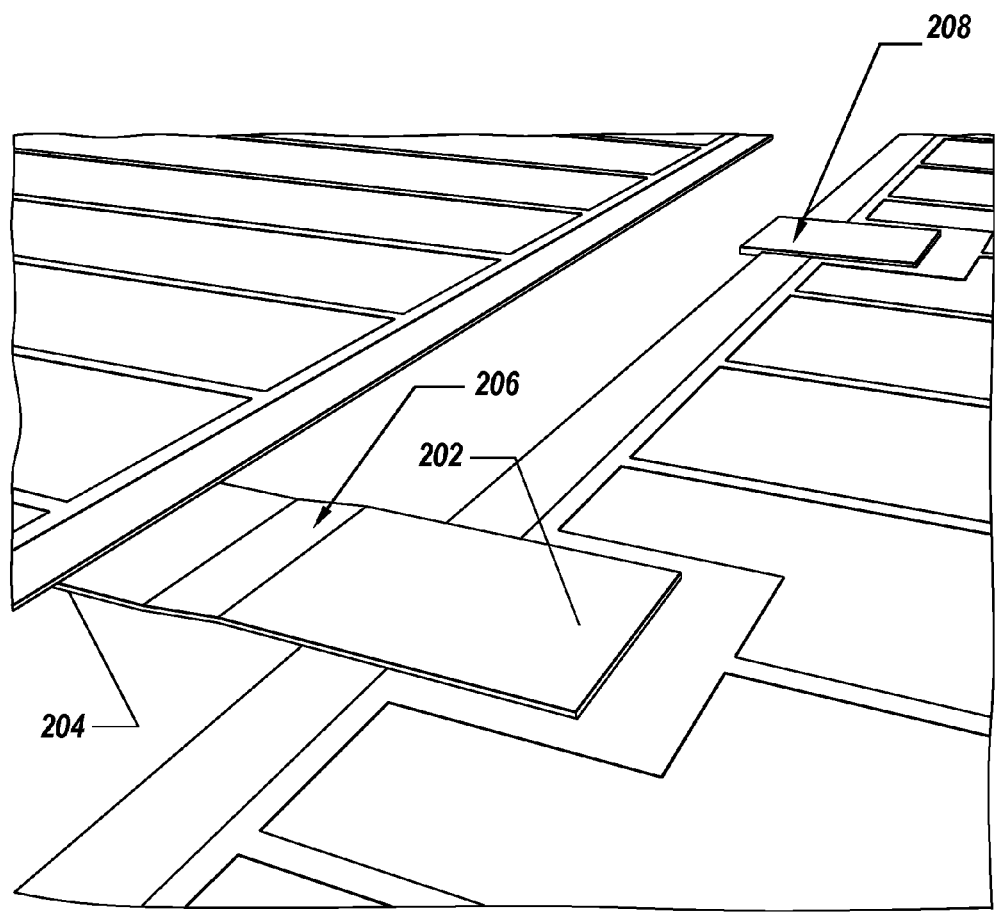
FIG. 2D is a side view close-up of an exemplary conventional interconnect tab used in connection with the conventional solar cell array illustrated in FIGS. 2A-2C.
Figure 3:
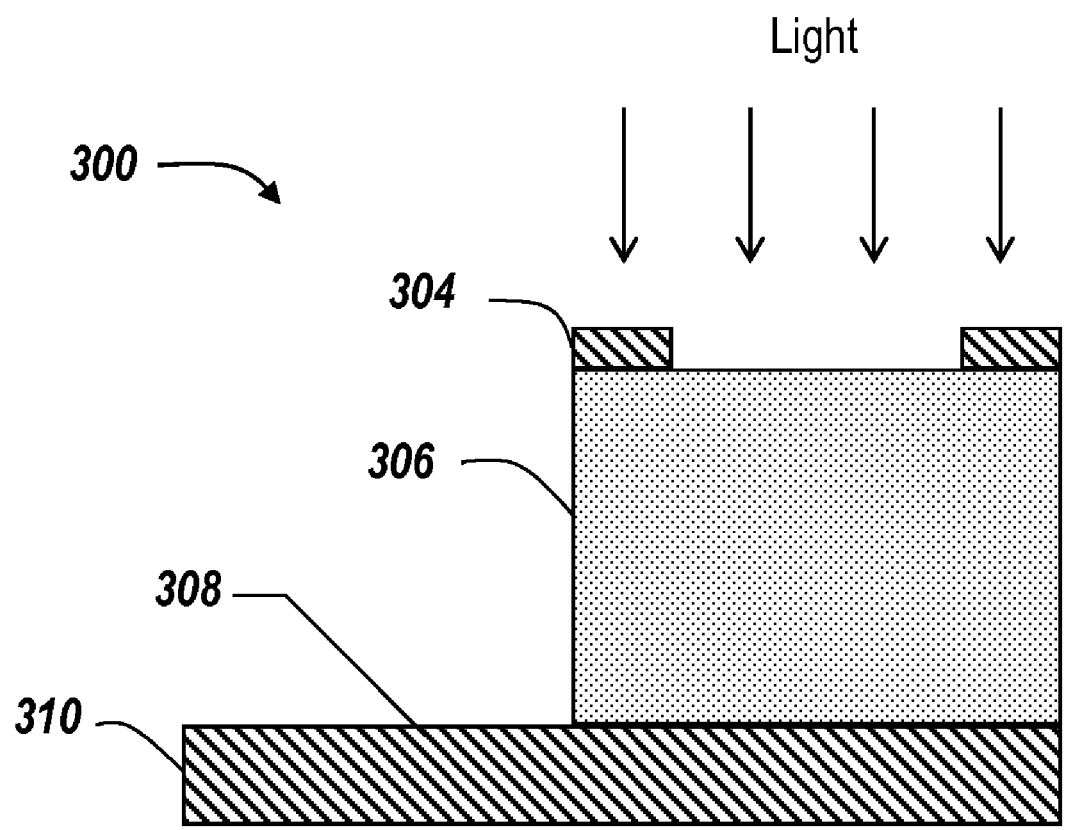
FIG. 3 is a cross-sectional of an exemplary solar cell with etched opening to expose the backmetal layer according to the teachings of the present invention.

The assembly technique of the present invention requires the solar cells to have a certain form. That is, semiconductor material in areas where interconnect tabs are to make contact with the backmetal of the solar cell are etched to expose a portion of the top surface of the backmetal layer as illustrated in FIG. 3. An epitaxial liftoff (ELO) methodology may be used to facilitate removing the semiconductor material to expose the backmetal layer according to various embodiments of the present invention. The ELO methodology involves removing or lifting epitaxial layers that form the solar cell device with an attached metal back layer from a substrate with the aid of a release layer. Once released, standard semiconductor fabrication processes can then be performed to etch portions of the epitaxial layers thereby exposing the backmetal. This etching process can be performed using chemical wet or dry etching processes since the epitaxial layers are relatively thin in the ELO approach. For conventional solar cells grown on bulk substrate materials such as Germanium, the removal of the active semiconductor material in order to expose the conductive back layer is more challenging because the active semiconductor layer stack is much thicker compared to the ELO approach.

An exemplary solar cell 300 formed according to teachings of the present application is illustrated in FIG. 3. The exemplary solar cell 300 includes a semiconductor layer 306 formed on top of a backmetal layer 310. A plurality of grid lines 304 may be formed on a top surface of the semiconductor layer 308. A portion of the semiconductor layer 306 is etched to expose a top surface of the backmetal layer 310. As a result, the backmetal layer 310 of the exemplary solar cell 300 according to various embodiments of the present invention includes an exposed etched surface 308.

As illustrated in FIG. 3, the solar cell 300 formed according to the teachings of the present invention includes a top surface that faces the light. The solar cell 300 includes a back surface that faces away from the light. Specifically, the top surface of the solar cell is the top surface of the semiconductor layer 306 that faces the light. The bottom surface of the solar cell is the bottom surface of the backmetal layer 310 that faces away from the light. The bottom surface of the solar cell 300 is opposite to the top surface of the solar cell 300. The solar cell also includes an exposed etched surface 308 that exposes a top surface of the backmetal layer 308 of the solar cell 300. The top surface of the backmetal layer 308 of the solar cell 300 is opposite to the bottom surface of the backmetal layer 308 of the solar cell 300. That is, the top surface of the backmetal layer 308 of the solar cell is adjacent and in physical contact with the bottom surface of the semiconductor layer 306 of the solar cell 300.

A plurality of adjacent solar cells 300 with exposed etched surfaces 308 may be electrically connected in series and/or in parallel. All connections, including diode connections and interconnections between adjacent solar cells, may be made solely from one surface of the solar cell array as shown in FIGS. 4A-4D. The assembly method described herein eliminates connecting interconnect tabs to the front and back surface of adjacent solar cells as depicted in FIGS. 2A-2D in accordance with the conventional assembly techniques.

As illustrated in FIGS. 4A-4D, interconnect tabs 406 electrically bridge adjacent solar cells 300 in series or in parallel by connecting the top surface, e.g. a top grid line, of one solar cell to the top surface of the backmetal layer of an adjacent solar cell.

Figure 4A:
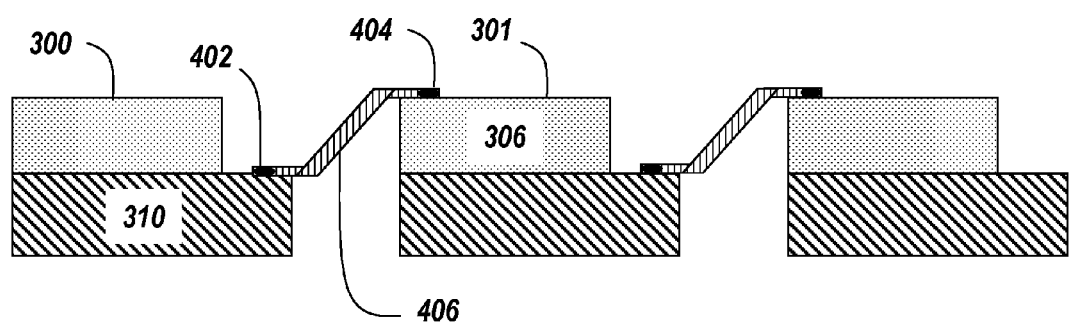
FIG. 4A is a side view of an exemplary solar cell array connected using the interconnect scheme in accordance with the teachings of the present application.

FIG. 4A is a side view of an exemplary solar cell array 400 connected using the interconnect scheme in accordance with the teachings of the present application. As illustrated in FIG. 4A, adjacent solar cells 300 and 301 may be connected by forming a top or front connection 402 on the exposed etched surface 308 formed on the backmetal layer 310 of a first solar cell 300 and by forming another top connection 404 on the top surface of the semiconductor layer 306 of an adjacent second solar cell 301. As such, the interconnect tab 406 is connected to the top surface of the backmetal layer 310 of the first solar cell 300 and to the top surface of the semiconductor layer 306 of the adjacent solar cell 301.

Figure 4B:
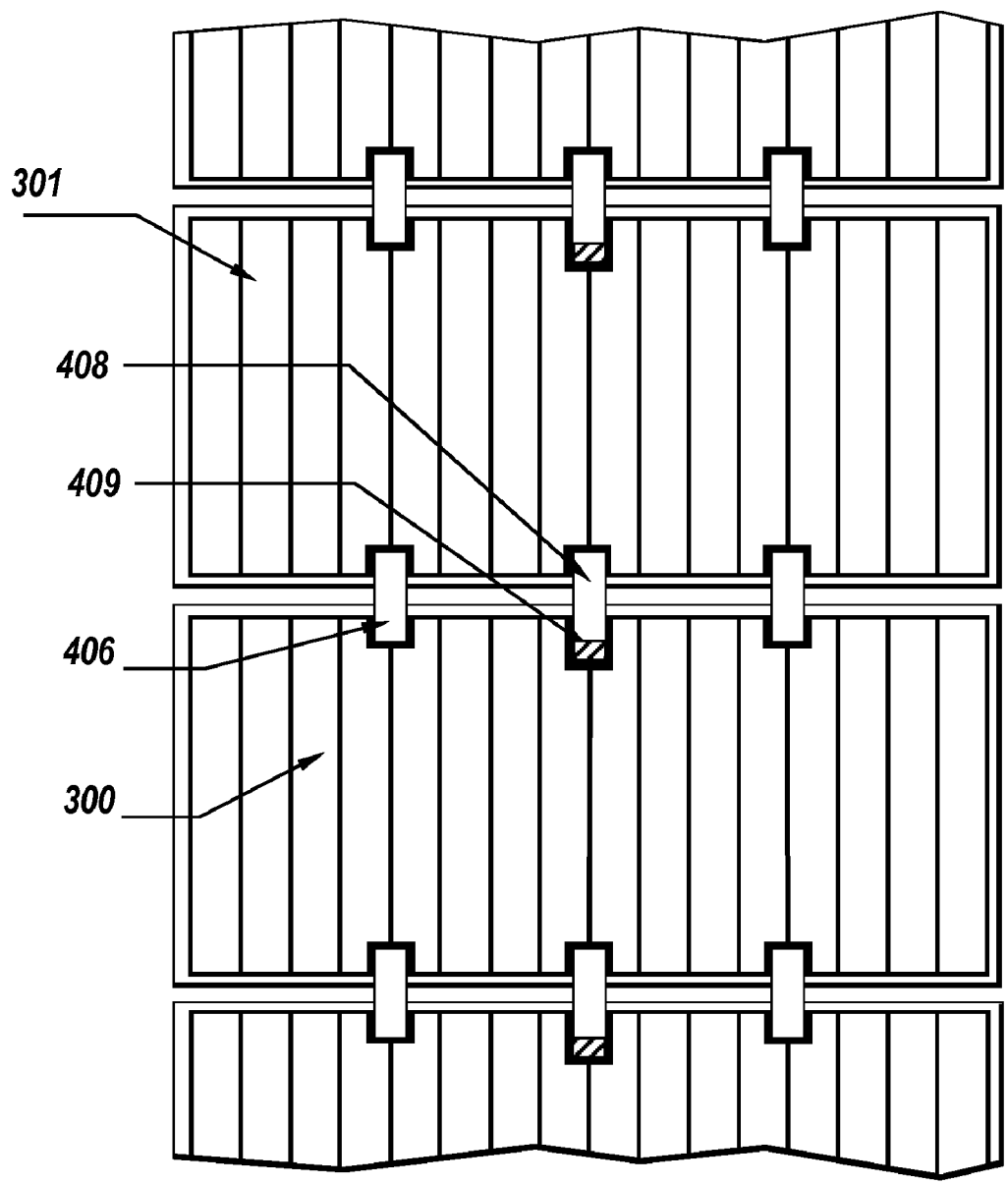
FIG. 4B is a top view of the exemplary solar cell array illustrated in FIG. 4A.
Figure 4C:
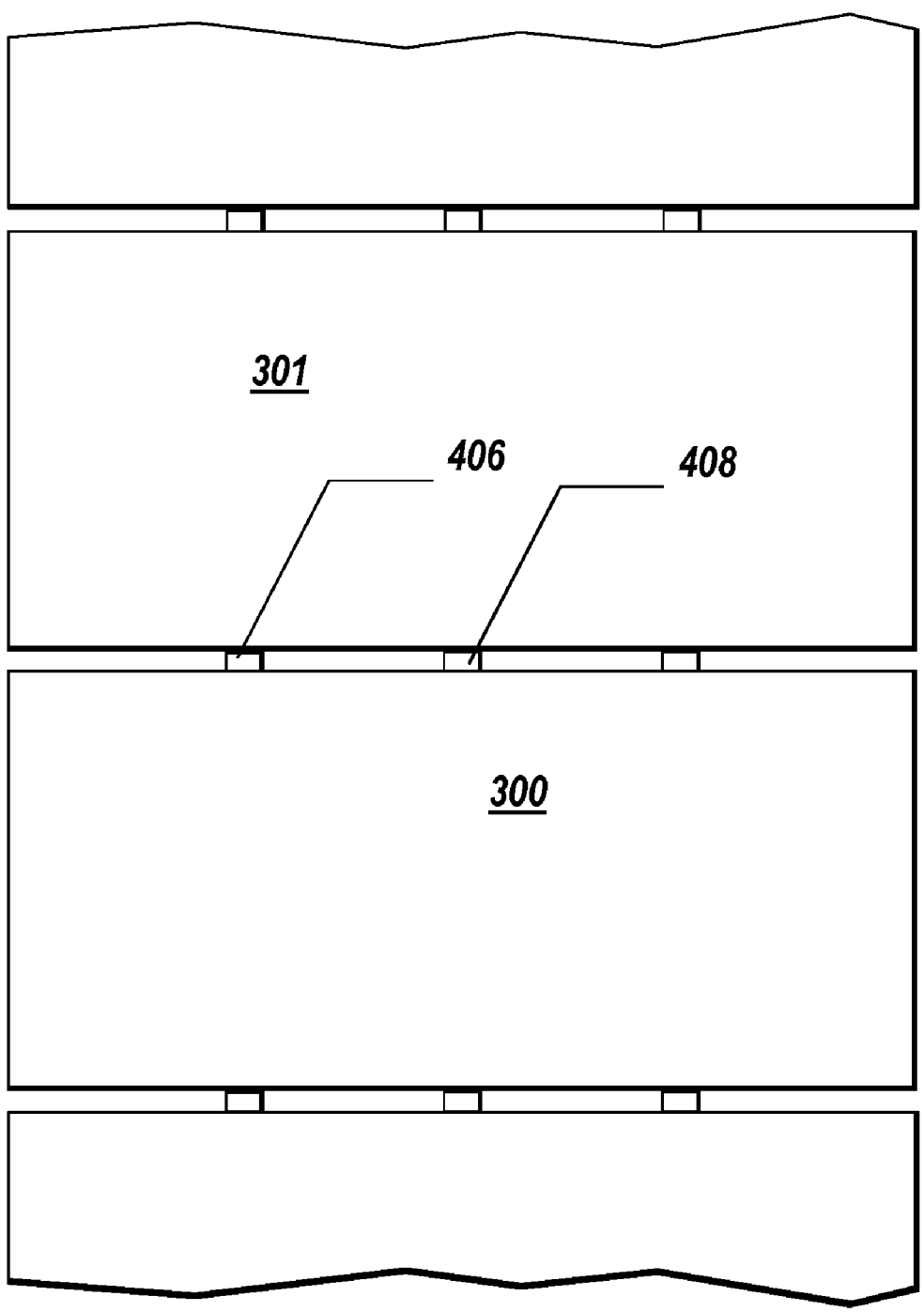
FIG. 4C is a bottom view of the exemplary solar cell array illustrated in FIG. 4A.

FIG. 4B is a top view of the exemplary solar cell array 400 illustrated in FIG. 4A. FIG. 4C is a bottom view of the exemplary solar cell array 400 illustrated in FIG. 4A. FIGS. 4B-4C illustrate diode 409 attached to the etched surface 308 of the backmetal layer from top front surface of the solar cell 300. One surface of the diode 409 is connected to the backmetal through an etched opening 308 in the epitaxial solar cell material. The opposite surface of the diode 409 is attached to a bypass diode tab 408 that in turn is connected to the top surface of the adjacent second solar cell 301 to form the bypass connection. This connection scheme is effectively able to bypass the first solar cell 300 when necessary without the need for wrap around bypass diode tabs as seen in conventional solar cells. The flexibility of this approach also allows adjacent solar cells to be formed into either serial or parallel arrays to support either higher voltage or higher current applications, as required.

Figure 4D:
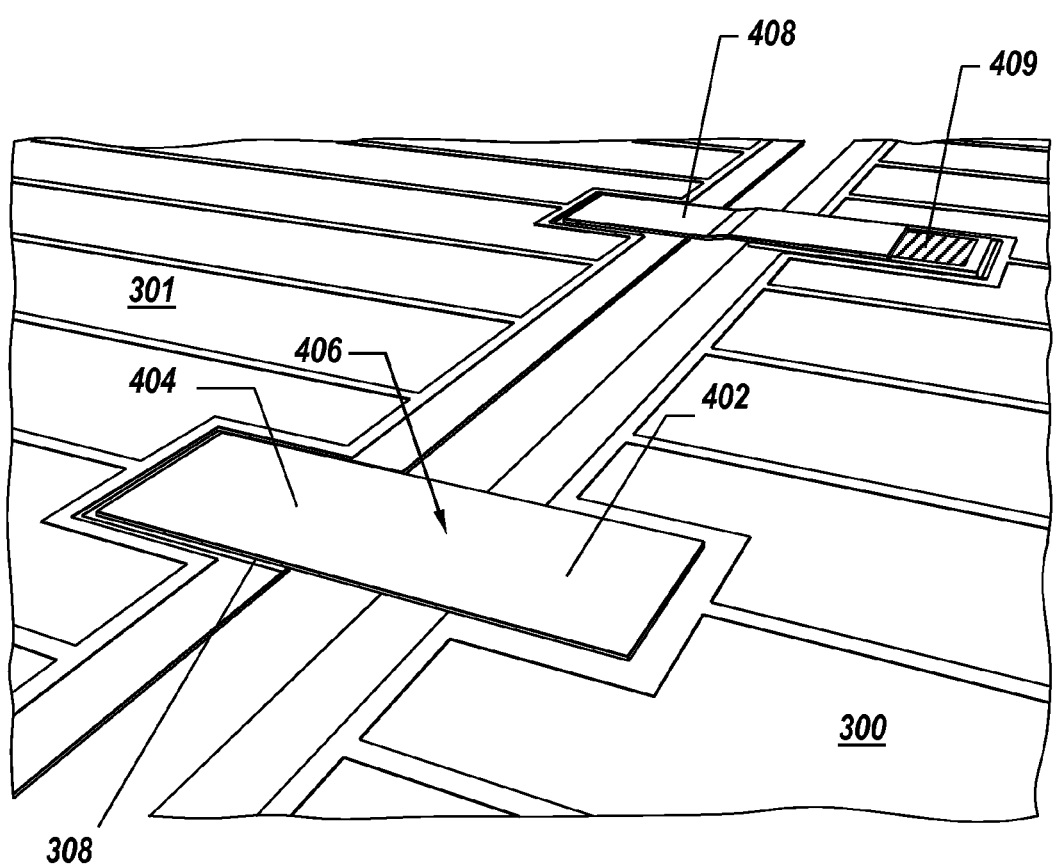
FIG. 4D is a side view close-up of an exemplary interconnect tab used in connection with the exemplary solar cell array according to an exemplary embodiment of the present invention.

FIG. 4D is a side view close-up of an exemplary interconnect tab 406 and a bypass diode tab 408 used in connection with the exemplary solar cell array according to an exemplary embodiment of the present invention. As illustrated in FIG. 4D, the interconnect tab 406 is connected to the top surface of the first solar cell 300 via the top connection 402. The interconnect tab 406 is also connected to the top surface of the adjacent solar cell 301 via the top connection 404. Specifically, the interconnect tab 406 is connected to the exposed etched surface 308 formed on the top surface of the backmetal layer 310 of the adjacent solar cell 301. As further illustrated in FIG. 4D, the bypass diode tab 408 is connected to the bypass diode 409 provided on the top surface of the solar cell 300. The bypass diode tab 408 is also connected to the top surface of the adjacent solar cell 301. The bypass diode tab 408 is connected to an exposed etched surface 308 of the adjacent solar cell 301.

The solar cell assembly technique described herein may be used with a plurality of solar cell types, including but not limited to, single junction solar cells, dual junction solar cells, and multi-junction solar cells such as inverted metamorphic multi-junction (IMM) solar cells, etc.

Figure 5:
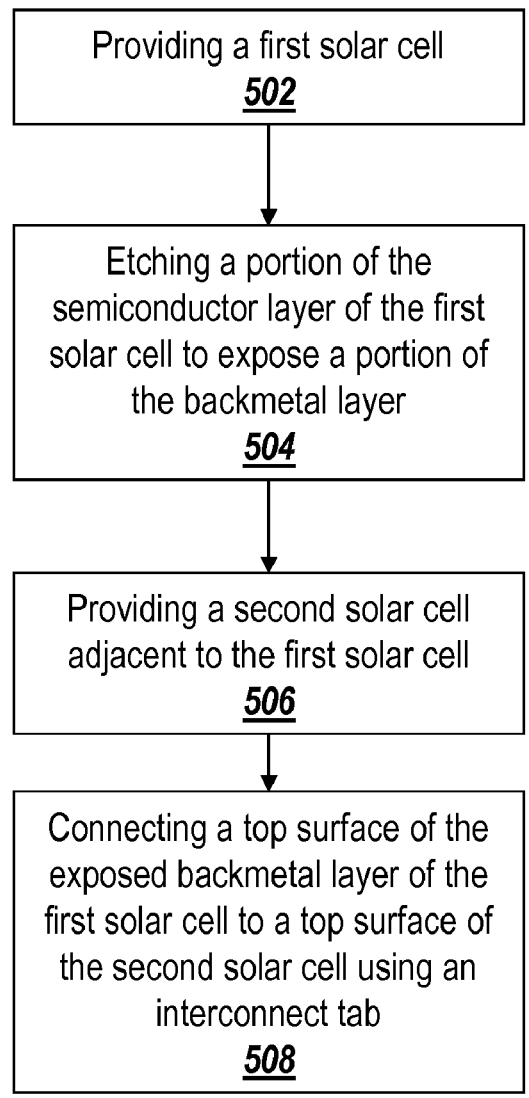
FIG. 5 is a schematic flow chart diagram depicting the steps for assembling a solar cell array using the interconnect scheme according to the teachings of the present application.

Exemplary steps of the assembly method for forming solar cell arrays according to the various embodiment of the present application are illustrated in the flowchart 500 of FIG. 5. The method includes providing a first solar cell (step 502). The first solar cell may be a conventional solar cell including a semiconductor layer provided on top of a backmetal layer. A portion of the semiconductor layer of the first solar cell is etched to expose a portion of the top surface of the backmetal layer (step 504). A second solar cell is provided adjacent to the first solar cell (step 506). The second solar cell may be a conventional solar cell or, alternatively, the second solar cell may be formed according to the teachings of the present application to include an exposed etched backmetal surface. If the second solar cell is not connected to another solar cell other than the first solar cell, the second solar cell does not need to have an exposed etched surface. The top surface of the exposed backmetal layer of the first solar cell is connected to the top surface of the second solar cell using an interconnect tab (step 508). The top surface of the second solar cell may include one or more grid lines. The top surface of the exposed backmetal layer of the first solar cell may be connected to a grid line provided on the top surface of the second solar cell.

Figure 6:
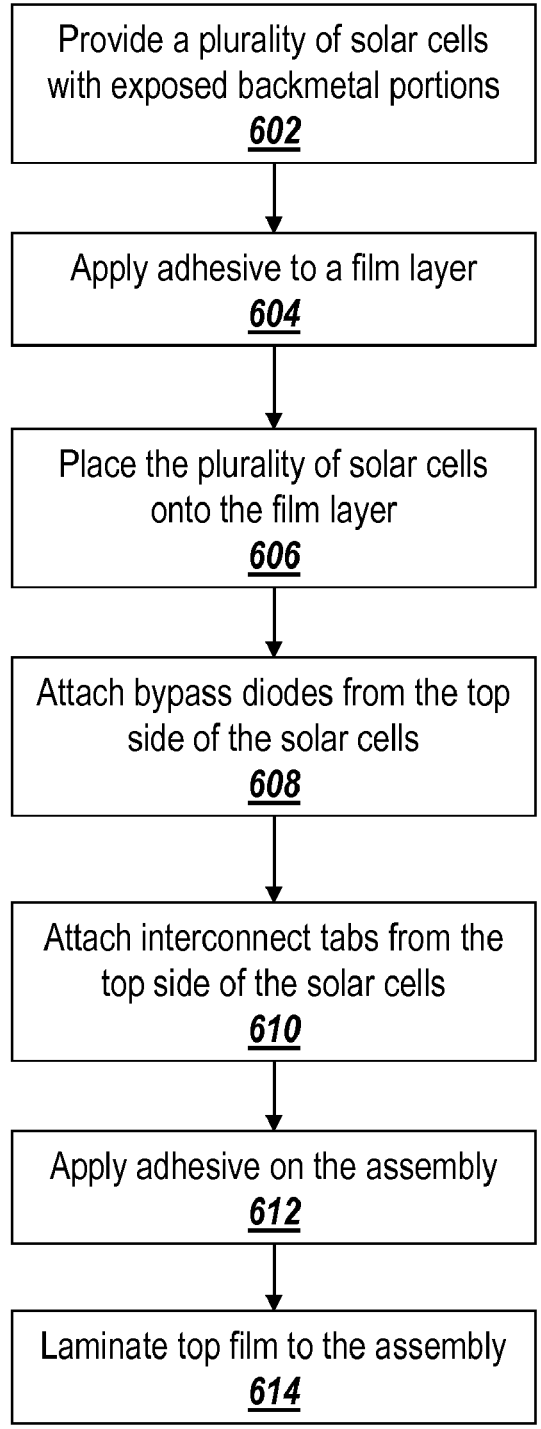
FIG. 6 is a schematic flow chart diagram depicting the steps for forming an array of solar cells according to the teachings of the present invention.

FIG. 6 illustrates a flowchart 600 describing the steps for forming a solar cell assembly using the connection method of the present application. A plurality of solar cells with exposed backmetal portions are provided (step 602). As described herein, a solar cell may be formed to include an etched surface on the top surface of the backmetal layer. An adhesive is applied to a film layer to secure the plurality of solar cells on the film layer (step 604). The plurality of solar cells is placed onto the film layer, for example, to form a solar cell array (step 606). Bypass diodes are attached and/or connected to the solar cells from the top side of the solar cells (step 608). The bypass diodes may be attached to the solar cells by welding or any other appropriate method. The interconnect tabs are attached to the solar cells from the top side of the solar cells (step 610). The interconnect tabs may be attached to the solar cells by welding or any other appropriate method. Adhesive is applied on the assembly (step 612). Top film is laminated to the assembly to secure the plurality of solar cells in place (step 614). The top film and the adhesive must have the required properties for transmitting maximum light intensity and spectrum to the underlying solar cells.

The assembly method for forming solar cell arrays described herein enables fast and efficient high-volume manufacturing since the bonding tool only needs to access the solar cell array from one single side. This also reduces handling of the solar cell arrays, reduces the possibility of damage, which, in turn, increases the yield of solar cells from the fabrication and assembly processes.

Numerous modifications and alternative embodiments of the present application will be apparent to those skilled in the art in view of the foregoing description. Accordingly, this description is to be construed as illustrative only and is for the purpose of teaching those skilled in the art the best mode for carrying out the present application. Details of the structure may vary substantially without departing from the spirit of the present application, and exclusive use of all modifications that come within the scope of the appended claims is reserved. It is intended that the present application be limited only to the extent required by the appended claims and the applicable rules of law.

It is also to be understood that the following claims are to cover all generic and specific features of the invention described herein, and all statements of the scope of the invention that, as a matter of language, might be said to fall therebetween.

The invention claimed is:

1. A method for interconnecting a first solar cell adjacent to a second solar cell in an array of solar cells, the method comprising:
   providing a first solar cell adjacent to a second solar cell, wherein at least the first solar cell includes a semiconductor layer formed on top of a backmetal layer;
   etching a portion of the semiconductor layer of the first solar cell to expose a portion of a top surface of the backmetal layer of the first solar cell; and
   interconnecting the first solar cell and the second solar cell by coupling the exposed top surface of the backmetal layer of the first solar cell to a top surface of the second solar cell using an interconnect tab.

2. The method of claim 1, further comprising:
   forming a metalized portion on the top surface of the second solar cell, wherein the exposed top surface of the backmetal layer of the first solar cell is coupled to the metalized portion formed on the top surface of the second solar cell.

3. The method of claim 1, further comprising:
   forming a release layer on a substrate;
   forming an array of solar cells on the release layer, the array including at least the first solar cell adjacent to the second solar cell;
   removing the release layer between the substrate and the array of solar cells; and
   separating the array of solar cells from the substrate.

4. The method of claim 1, wherein the first solar cell and second solar cell are interconnected from a same side of the first solar cell and the second solar cell.

5. The method of claim 1, wherein the first solar cell and the second solar cell are interconnected from a top side of the first solar cell and a top side of the second solar cell.

6. The method of claim 1, wherein the first solar cell and the second solar cell are interconnected by coupling a top side of the first solar cell to a top side of the second solar cell.

7. The method of claim 1, wherein interconnecting the first solar cell and the second solar cell forms a serial connection between the first solar cell and the second solar cell.

8. The method of claim 1, wherein interconnecting the first solar cell and the second solar cell forms a parallel connection between the first solar cell and the second solar cell.

9. The method of claim 1, wherein interconnecting the first solar cell and the second solar cell forms a parallel connection and a serial connection between the first solar cell and the second solar cell.

10. The method of claim 1, further comprising:
    connecting a bypass diode to a portion of the top surface of the second solar cell, wherein the first solar cell and the second solar cell are interconnected by coupling the exposed top surface of the backmetal layer of the first solar cell to the bypass diode of the second solar cell.

11. The method of claim 10, wherein the first solar cell and the second solar cell are interconnected from a same side of the first solar cell and the second solar cell.

12. The method of claim 10, wherein the first solar cell and the second solar cell are interconnected from a top side of the first solar cell and a top side of the second solar cell.

13. The method of claim 1, wherein the interconnect tab is a metallic interconnect tab.

* * * * *